United States Patent [19]

Kalfus

[11] 3,925,688

[45] Dec. 9, 1975

[54] INTEGRAL CYCLE ZERO-VOLTAGE SWITCHING CIRCUITS

[75] Inventor: Martin Aaron Kalfus, Morganville, N.J.

[73] Assignee: RCA Corporation, New York, N.Y.

[22] Filed: Jan. 29, 1975

[21] Appl. No.: 545,158

[52] U.S. Cl... 307/252 B; 307/252 N; 307/252 UA; 323/18; 323/19; 323/24

[51] Int. Cl.$^2$ .......................................... H03K 17/72

[58] Field of Search......... 307/252 B, 252 N, 252 P, 307/252 T, 252 UA, 252 W; 323/18, 19, 24, 22 SC, 38

[56] References Cited

UNITED STATES PATENTS

| | | | |
|---|---|---|---|
| 3,506,852 | 4/1970 | De Hart | 307/252 UA |
| 3,633,095 | 1/1972 | Hood | 323/19 X |
| 3,715,606 | 2/1973 | Travin et al. | 307/252 UA |
| 3,745,378 | 7/1973 | Pritchett | 307/252 UA |
| 3,780,318 | 12/1973 | Werts et al. | 307/252 UA |

*Primary Examiner*—John Zazworsky
*Attorney, Agent, or Firm*—H. Christoffersen; S. Cohen; R. G. Coalter

[57] ABSTRACT

An input signal having a period T is applied to a series connected load and triggerable bidirectional switch. A zero crossing detector provides a trigger pulse at each axis crossing of either the input signal or the voltage across the switch. A circuit, including a monostable multivibrator triggered at alternate axis crossings of the input signal and having an ON-period between T/2 and T, applies the detector trigger pulses to the switch during the ON-period. Triggering of the multivibrator is controlled by a further circuit so that switching at the zero crossings of the input signal or the potential across the switch for an integral number of cycles is thereby provided during the period that the multivibrator is triggered.

9 Claims, 4 Drawing Figures

INTEGRAL CYCLE ZERO-VOLTAGE SWITCHING CIRCUITS

This invention relates to alternating current switching circuits and particularly to integral cycle zero voltage alternating current switching circuits.

The advantages of zero voltage switching of alternating current signals are well known. Where conventional zero voltage switches are employed in a proportional temperature controller, however, it is possible that "half cycling" may occur. Half cycling refers to the condition which occurs near the desired temperature equilibrium point when the switch is supplying half cycles of current to the heater. This results in an undesirable direct current component of load current which could cause overheating of a power transformer on the utility lines. A related problem exists where a zero voltage switch is employed for switching a low power factor (inductive) load such as a motor or power transformer. It is desirable that such loads receive no net direct current component which could cause saturation of the load and excessively high in rush currents.

It is known that the problems of half-cycling in proportional controllers and load saturation in inductive switching circuits can be overcome by employing a zero voltage switch which includes means for assuring that only an integral (whole) number of cycles of load current are delivered to the load during the period that the switch is turned on.

Prior art circuits capable of this form of switching are known. Examples of such switches are described in RCA Corporation Application Note ICAN-6182 entitled "Features and Applications of RCA Integrated-Circuit Zero-Voltage Switches" by A. Sheng, G. Graneri and J. Yellin and published in Oct., 1973. The note describes circuits in which a zero voltage detector triggers a triac at positive axis crossings of the applied voltage. A capacitor charged by the load voltage during the positive half cycle of load current retriggers the triac during the negative half cycle thereby providing only integral cycles of current to the load. This circuit is well suited to high power factor loads but requires a diode-resistor-capacitor network connected across the load and the diode and capacitor must be of high voltage ratings. Such components are relatively expensive and bulky.

Another approach to integral cycle zero voltage switching involves the use of relatively complex arrangements of bistable storage elements and logic circuits which, in effect, "count" the number of half cycles of load current, "remember" whether the number is even or odd and either supply or withhold a final triac trigger pulse at turn-off to assure that only an even number of half cycles of current are delivered to the load.

A need exists for a relatively simple integral cycle zero voltage switching circuit requiring no high voltage diodes or capacitors. A need also exists for such a circuit operable with high power factor loads but requiring no load voltage sampling. A further need exists for a switch operable with loads of any power factor for providing integral cycle switching at the zero crossings of the load current. The present invention is directed to meeting these needs.

In embodiments of the present invention an alternating current input signal having a period T is applied to a series connected load and triggerable bidirectional switch. A first circuit responsive to the input signal produces a control signal which is at a first level for a period between T/2 and T beginning at an axis crossing of a given sense of the input signal and at a second level for the remainder of the period. A second circuit produces a trigger signal at each axis crossing of the input signal or, alternatively, the potential across the switch. A third circuit receptive of the trigger and control signals applies trigger signals to the switch solely when the control signal is at the first level. A fourth circuit controls initiation and termination of the control signal, in each case solely when the control signal is at the second level.

The invention is illustrated in the accompanying drawings wherein like reference numbers designate like elements and in which.

Figure 3:
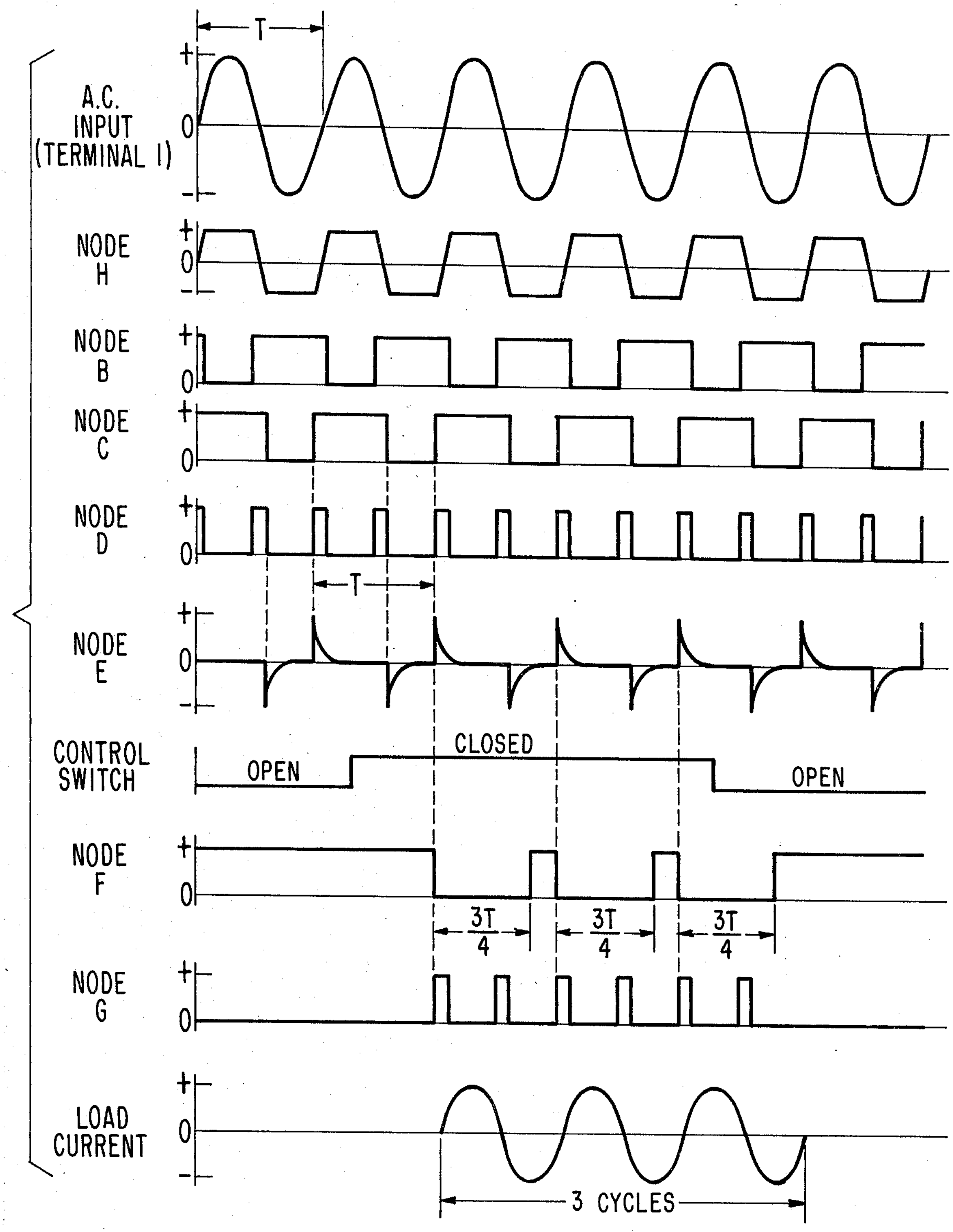
FIGS. 3 and 4 are waveform diagrams illustrating operation of the switches of FIGS. 1 and 2, respectively.

In the following discussion of the circuit of FIG. 1 reference will be made to the corresponding circuit waveforms shown in FIG. 3. For convenience of explanation, terminal 2 is assumed to be the circuit ground reference terminal and the waveforms of FIG. 3 are drawn accordingly. In a given application, of course, either one of the circuit input terminals, 1 or 2, may be at a reference voltage point such as ground.

Symmetrical limiter 10 comprises a circuit node H connected to input terminal 1 by current limiting resistor 12 and connected to input terminal 2 by a pair of series connected oppositely poled Zener diodes 14 and 18 which have substantially equal Zener breakdown voltages. Diodes 14 is connected at its cathode 13 to node H and at its anode 15 to anode Diode of diode 18 which is connected at its cathode 19 to input terminal 2. Limiter 10 produces a symmetrical alternating polarity output signal of limited amplitude in response to the alternating current input signal applied across terminals 1 and 2. This is illustrated in FIG. 3 where it is seen that as the potential of terminal 1 increases the potential of node H increases in the same sense until limited by the breakdown of one or the other of the Zener diodes. The waveform shown for node H is drawn to an expanded scale relative to that shown for terminal 1 to emphasize two of its salient characteristics. The first is that the zero crossings of the node H waveform occur at the same time as those of terminal 1 and, due to the limiting action, changes in the node H voltage occur quite rapidly as the AC signal crosses through the zero axis. This results in a precise indication that a zero axis crossing of the AC signal has occurred. The second, also due to this limiting action, is that the node H voltage is relatively insensitive to substantial variations in the amplitude of the AC input signal. Since, as will be explained, the circuit timing and operating potentials are derived from the node H voltage, the switch of FIG. 1 may therefore be used at different nominal line voltages (e.g. 110V or 220V) without readjustment.

Direct current (D.C.) supply 20 includes a rectifying diode 22 connected at its anode 24 to node H and at its cathode 26 to node J. A filter capacitor 28 is connected between node J and input terminal 2. In operation, positive cycles of the node H voltage are rectified by diode 22 and smoothed by capacitor 28 to produce a constant direct current potential at node J. This potential is utilized as a source of operating power for zero crossing detector 39, monostable multivibrator 60 and trigger gate and driver 80. Since positive cycles of the node H voltage are limited by Zener diode 14, the node J potential is therefore insensitive to variations in the A.C. input signal applied across terminals 1 and 2.

Zero crossing detector 30 includes an input node A and three output nodes, B, C and D. First, second and third pull-up resistors, 31, 32 and 33 respectively, are connected between node J and nodes B, D and C, respectively. Diode 34 is connected at its anode to node D and at its cathode to node B. Diode 35 is connected at its anode to node D and at its cathode to node C. Node B is connected to the collectors of Darlington connected transistors 40 and 41 and node C is connected to the collectors of Darlington connected transistors 42 and 43. Transistor 43 is connected at its base to input terminal 2 and at its emitter to the base of transistor 42 which is connected at its emitter to voltage divider output terminal 50. Transistor 41 is connected at its base to terminal 50 and at its emitter to the base of transistor 40 which is connected at its emitter to input terminal 2. Voltage divider output terminal 50 is connected to node A by resistor 51 and to terminal 2 by resistor 52.

In the detector operation, node B is clamped to ground (i.e., the potential of terminal 2) when a positive potential at node H (divided by resistors 51 and 52) is of a value sufficient to turn on Darlington connected transistors 41 and 40. Conversely, node C is clamped to ground when the potential at node H is sufficiently negative to turn on Darlington connected transistors 43 and 42. If either nodes B or C are clamped to ground, diode 34 or diode 35, respectively, will be forward biased so that node D will also be clamped to ground. The only condition when node D is not clamped to ground occurs when neither node B nor node C is clamped to ground. In that condition, pull up resistor 32 raises the potential of node D to that of node J. Since this condition occurs only when the AC input signal is at or near a zero axis crossing, the node D signal gives a precise indication of each axis crossing as shown in FIG. 3. This signal is used, as will be described, for providing trigger pulses to triac 91. The node C signal, which has a positive transition just prior to each positive axis crossing and a negative transition just after each negative axis crossing, is used as a source of trigger pulses for multivibrator 60. The node B signal, which has a positive transition just prior to each negative axis crossing and a negative transition just after each positive axis crossing, is not used other than for generation of the node D signal.

Monostable multivibrator 60 includes an input node E and an output node F. Node E is coupled to node C by coupling capacitor 61 and is connected to terminal 2 by load resistor 62. A first two input NOR gate 70 is connected at one of its input terminals to node E by two position ON/OFF control switch 65 and at its output terminal to node F. An inverter 72, formed by a second two input NOR gate, is connected at its output terminal to the other input terminal of NOR gate 70 and is coupled at its commonly connected input terminals to node F by timing capacitor 74 and to node J by timing resistor 76.

Capacitor 61 and resistor 62 form a differentiating network producing a differentiated pulse at node E for each transition of the node C signal. As shown in FIG. 3, a negative transition of the node C signal results in negative pulse at node E and a positive node C signal transition results in a positive pulse at node E. The positive node E pulses are used for triggering the multivibrator comprised of gates 70 and 72, resistor 76 and capacitor 74 when control switch 65 is in the ON position. For the particular multivibrator shown, the negative node E pulses have no effect upon its operation.

In operation, node F initially is at the potential of node J (positive). When a positive node E pulse is applied to the input of gate 70, node F goes low — is driven to ground potential. This low potential, applied via capacitor 74 to inverter 72, causes the second input to NOR gate 70 to go high so that node F continues at a low level even after the short duration positive pulse at node E terminates. However, the low voltage initially present at the input to inverter 72 immediately starts to increase in response to the charging current applied from node J to capacitor 74. When this potential reaches the threshold level of inverter 72, the positive feedback terminates, that is, the output of inverter 72 switches from a high to a low (ground) level and as the second input to gate 70 also is low, node F returns to its initial condition.

The values of resistor 76, capacitor 74 the node J potential and the threshold voltage of inverter 72 are selected for a monostable time constant greater than one-half but less than a full period of the alternating current input signal. Preferably, this time constant is equal to three-quarters of the input signal period. Such operation, in terms of the node C, node E and node F signals and the position of control switch 65 is illustrated in detail in FIG. 3.

Trigger gate and driver circuit 80 includes a driver transistor 81 connected at its emitter to node G by current limiting resistor 82 and at its collector to node J. A third two input NOR gate 83 is connected at its output terminal to the base of driver transistor 81 and at one of its input terminals to node F. Its other input is connected to the output terminal of an inverter 84 formed by a fourth two input NOR gate which is connected at its input terminals to node D.

The trigger gate and driver circuit logically combines the node D and node F signals and amplifies the power of the resultant signal to a level suitable for triggering triac 91. Specifically, gate 84 inverts the node D output signal. NOR gate 83, which receives the inverted node D output signal and the node F signal, produces a positive output signal solely when both of its input signals are at ground level. This signal, buffered by common collector connected driver transistor 81 and applied to node G by current limiting resistor 82, is used for triggering triac 91. Since the inverted node D signal is at ground level at each axis crossing of the input signal and the node F signal is at ground level for a period between T/2 and T measured from a given positive axis crossing, it follows that two trigger pulses will be produced at node G during each interval that the monostable multivibrator is triggered. Thus, for any number of activations of the multivibrator, solely an even number of trigger pulses (each occurring at a zero crossing of the input signal) are delivered to triac 91. This is illustrated in FIG. 3 where control switch 65 is shown to be closed for a length of time to produce three activations of multivibrator 60 thereby producing six trigger pulses at node G.

In output stage 90, triac 91 is connected at its first main terminal (MT-1) and gate to input terminal 2 and node G, respectively. A load 92 is connected between the triac second main terminal (MT-2) and input terminal 1.

The triac is triggered into a conductive state by the node G trigger pulses. Since it receives solely an even number of pulses (each occurring at axis crossing of the input signal) the triac conducts solely an even number of half cycles of load current. Thus, zero voltage switching of the load current for an integral number of cycles of the alternating current input signal is provided as illustrated by the load current waveform in FIG. 3.

Figure 1:
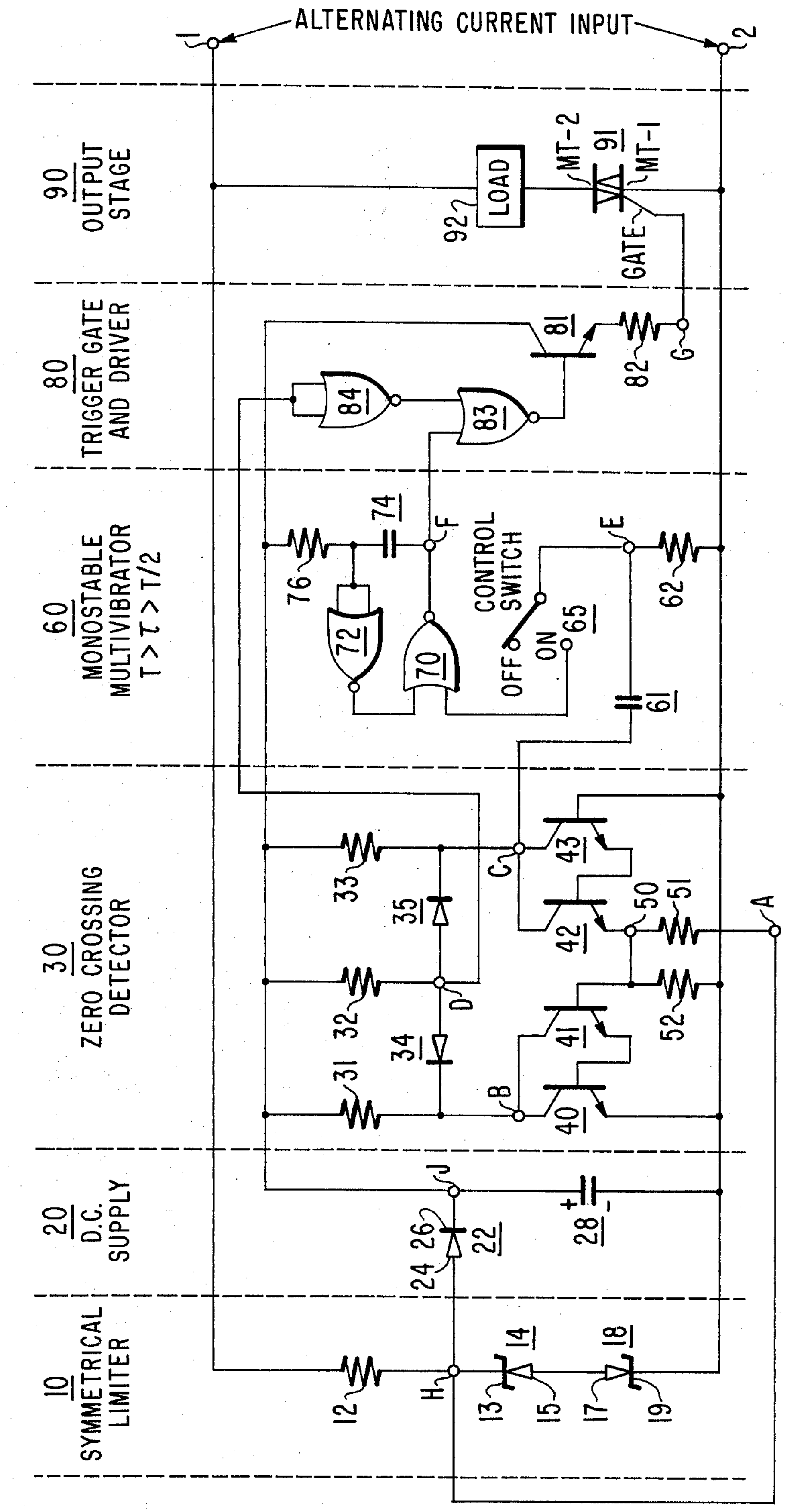
FIG. 1 is a circuit diagram of an integral cycle zero voltage switch according to the invention.

The embodiment of the invention of FIG. 1 is well suited for integral cycle zero voltage switching loads of moderately high power factor and has the advantage of not requiring a feedback connection to the second main terminal, MT-2, of triac 91. This simplifies installation of the switch where the triac is remotely located from the remainder of the switching circuitry as may be the case, for example, in high power switching applications where the thyristor is isolated for cooling purposes.

Figure 2:
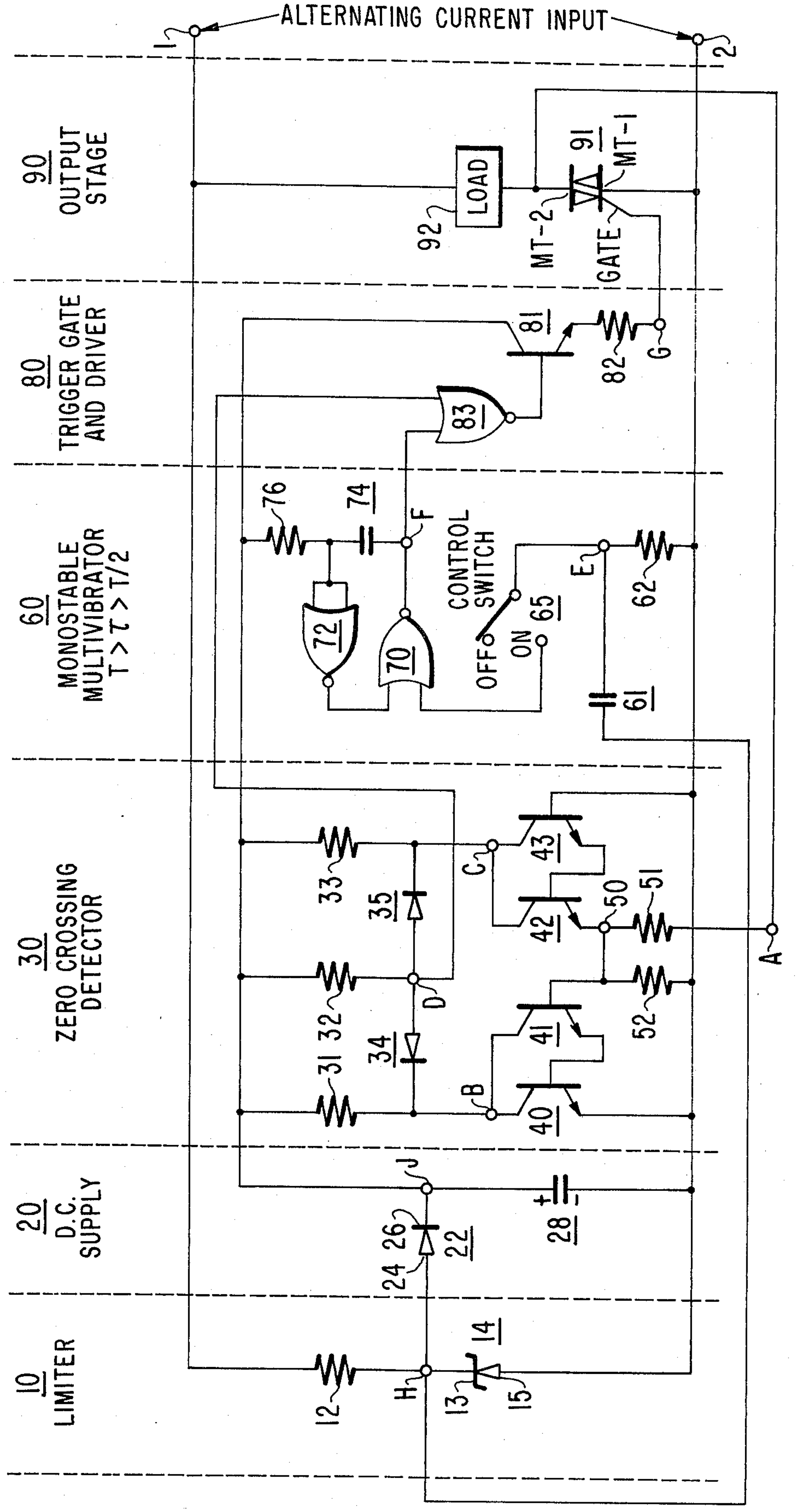
FIG. 2 is a circuit diagram illustrating a modification of the circuit of FIG. 1.
Figure 4:
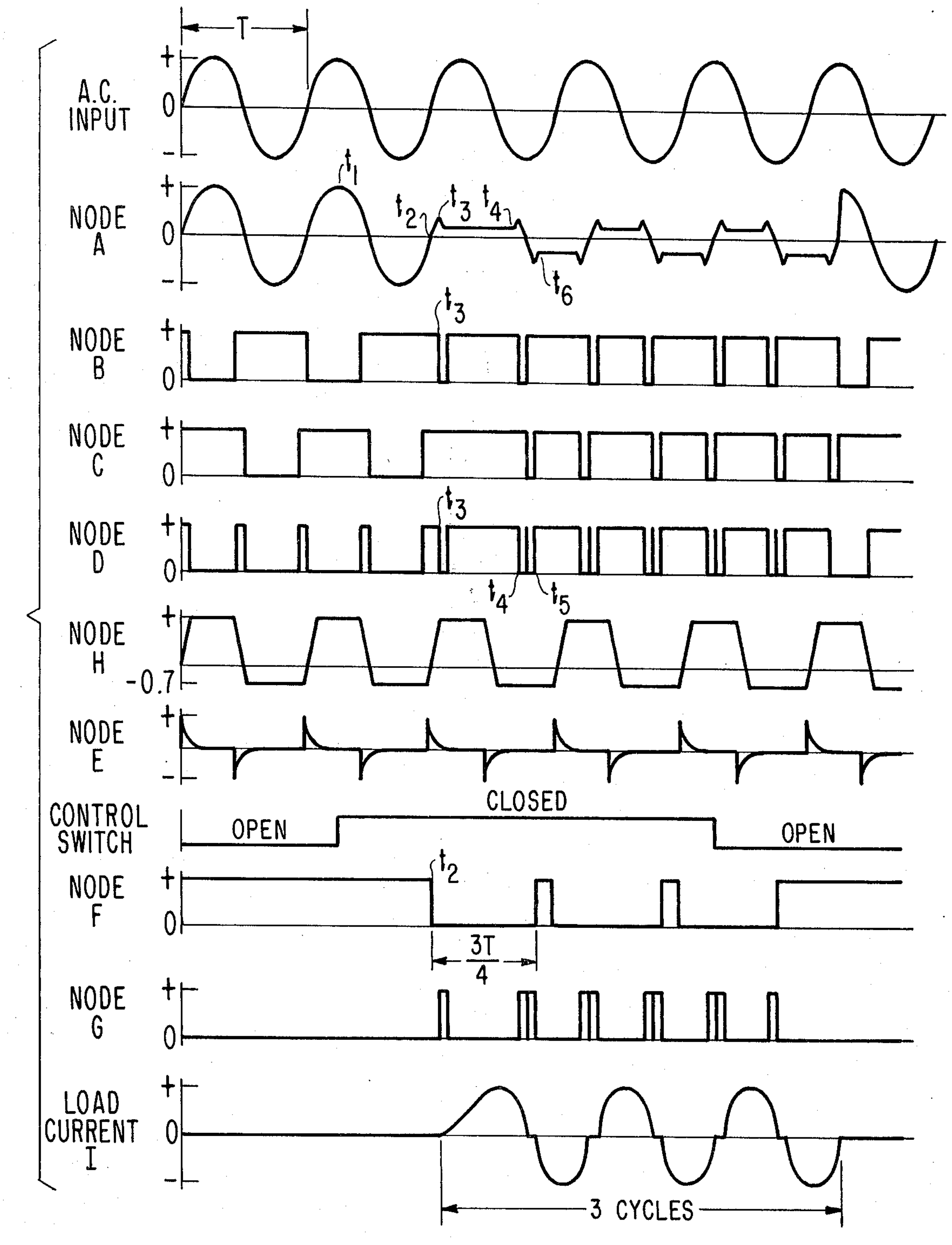

The modification shown in FIG. 2 does require a connection to the triac second main terminal but features integral cycle zero voltage switching for loads of any power factor between zero and unity. To emphasize this capability the following discussion and the waveforms of FIG. 4 are presented under the assumption of a worst case condition where the load is almost purely inductive (i.e., a substantially zero power factor load condition.)

Four modifications have been made to the circuit of FIG. 1 in the example of the invention shown in FIG. 2. First, Zener diode 18 has been eliminated and anode 15 of Zener diode 14 connected directly to input terminal 2. Second, node A, which was formerly connected to node H, is now connected to the second main terminal, MT-2, of triac 91. Third, capacitor 61, which formerly coupled node E to node C, now couples node E to node H. Fourth, inverter 84 has been eliminated and node D directly connected to the input terminal of NOR gate 83 which was formerly connected to the inverter 84 output terminal.

Diode 18, which was formerly required to provide symmetrical limiting of the node H signal, for use by the zero voltage detector, is not required in the circuit of FIG. 2 because the node H voltage is now applied to monostable multivibrator 60. As previously mentioned, the multivibrator is triggered by only the positive pulses applied to its input termial and is non-responsive to negative signals so symmetrical limiting of its input signal is not required. Diode 14 still provides limiting of positive potentials at node H to assure that D.C. supply 20 produces a regulated output voltage at node J which is independent of variations in the A.C. input signal as previously mentioned. Since diode 18 has been eliminated, the node H voltage, as shown in FIG. 4, varies between a maximum positive value determined by the Zener voltage of diode 14 and a maximum negative value determined by the diode 14 forward biased voltage drop (typically, a few hundred millivolts).

In general terms, the operation of the multivibrator and the trigger gate and driver circuits is the same as previously described. The multivibrator, for example, is triggered by positive axis crossings of the alternating current input signal when control switch 65 is closed and its period is between one half and one full period of the input signal as before. The only difference being that its trigger pulses are obtained from node H rather than node C since the node C potential is, in this example, no longer necessarily in phase with the axis crossings of terminal 1. The signal produced at node F in response to the A.C. input signal and the control switch position is precisely the same in the waveforms of FIG. 4 as shown in the corresponding waveforms of FIG. 3. The operation of gate 83 is similar to that previously described except that it receives true rather than complemented node D signals.

The feedback relationship between detector 30 and output stage 90, however, modifies the overall circuit operation in several respects. Although the modified circuit operation is not altogether simple it may be easily understood by reference to the detailed waveforms of FIG. 4. It is believed helpful first, however, to consider the overall circuit operation in general terms before discussing the details of the FIG. 4 waveforms.

Input terminals 1 and 2 receive the alternating current input signal having a period T. Zero crossing detector 30 is responsive, in this case, to the voltage across triac 91, rather than the voltage across the input terminals, for producing a trigger pulse at node D at each axis crossing thereof (as will be explained later, double pulses on either side of the axis crossings are produced in one state of the circuit operation). This trigger pulse is used for triggering the triggerable bidirectional switch (triac 91). Multivibrator 60 is responsive, when triggered, for producing a priming signal (ground level) at node F having a duration between T/2 and T. The differentiator (formed by capacitor 61 and resistor 62) and control switch 65 are responsive to the signal at node H when the control switch is in the ON condition for triggering the multivibrator once each period at positive axis crossings of the alternating current input signal. When the control switch is in the OFF condition, triggering of the multivibrator is inhibited. The trigger gate and driver circuit, 80, receives the trigger pulses (ground level signal) from node D and the priming signal (also ground level) from node F and applies the trigger pulses (positive signals due to the inversion provided by NOR gate 83) to the triac gate terminal solely when the priming signal is present. That occurs, in this circuit, when node F is at ground level and the node D signal makes a transition to ground.

The net result is that triac 91 is triggered ON closely after the first axis crossing of the alternating current input signal after switch 65 is closed and is thereafter triggered closely after the axis crossings of the load current which corresponds to the node A axis crossings. Since the load is assumed to be reactive, the first half cycle of load current flows through the triac for a period of time greater than T/2 but less than 3T/4 (i.e., between 180 and 270 electrical degrees of the input signal). After this transient condition, subsequent half cycles of load current occur at intervals T/2 apart.

Since the priming signal (Node F) occurs at alternate axis crossings of the input signal and is of a period 3T/4, it is assured that the triac is triggered twice to conduct an integral cycle of load current each time the priming signal is present. This results even under the worst case condition of a low power factor load such as an unloaded motor or unloaded transformer.

This operation is illustrated in detail by the waveforms of FIG. 4 where it is seen that during the interval $t_o$–$t_1$ (when the triac is OFF) the node A signal is a non-phase shifted replica of the A.C. input signal. There is no phase shift because there is no load current flow. When control switch 65 is closed at time $t_1$ the first subsequent positive node E pulse triggers monostable 60 thus priming gate 80. This occurs at the positive axis crossing of the node A signal at which time ($t_2$) the node D signal is positive. Unlike the circuit of FIG. 1, however, the positive node D signal does not enable gate 83 because inverter 84 has been eliminated. Thus gate 83 is enabled at time $t_3$ which occurs at the first negative transition of the node D signal ($t_3$) after the node A positive axis crossing and this produces a positive trigger pulse at node G. The node G pulse immediately triggers triac 91 which clamps node A to within the triac saturation voltage level relative to ground. This both initiates current flow in the load and terminates the node D and node G signals.

The load current undergoes an initial transient condition illustrated by the first half cycle of waveform I which decays during subsequent half cycles to a final steady-state condition. Specifically, in the transient condition the length of the first half cycle of load current (and thus the node A voltage) is greater than T/2 due to the assumed inductive nature of the load. Subsequent half cycles approach a length T/2 as the transient decays having a phase shift relative to the input signal which can approach (but cannot equal) 90° (T/4). Since the monostable multivibrator has a period 3T/4, it is apparent that the triac will be triggered twice each time the multivibrator is triggered once thereby conducting an integral cycle (one complete cycle) of load current even though the first half cycle is somewhat lengthened. The trigger point occurs, substantially at the zero crossings of the triac voltage rather than the terminal 1 voltage as in FIG. 1.

As the load current begins to decrease near the end of the first load current half cycle a point is reached (time $t_4$) when the load current magnitude becomes less than the minimum "holding" current required for the particular triac employed. At this point, which, occurs prior to the termination of the node F priming signal, the triac self-commutates off, the node A potential increases and the detector retriggers the triac to (at time $t_5$) conduct the negative half cycle of load current.

It should be noted in the above discussion that the waveforms of FIG. 4 are purposefully exaggerated in their time and amplitude scales to show the principal commutation and pulse details. Signal changes which occur at times $t_2$ and $t_3$, or $t_4$ and $t_5$, for example, actually occur substantially simultaneously so that the triac conducts substantially a full cycle (360 electrical degrees) of load current each time the multivibrator is triggered.

As an aside, it is to be noted also that the spike in the node D waveform occuring at the zero voltage crossing of the node A waveform has no effect on the circuit operation since gate 83 is activated by simultaneous ground level signals at its input terminals and such signals are present immediately before and after the spike occurrence.

Numerous changes and modification may be made in the circuits of FIGS. 1 and 2 to suit the needs of the particular circuit application desired. For example, it is not essential that multivibrator 60 be triggered from either node C as shown in FIG. 1 or from node H as shown in FIG. 2. It must be triggered at every other axis crossing (i.e., alternate crossings) of the alternating current input signal and this may be accomplished by suitably connecting capacitor 61 to circuit input terminal 1.

While a differentiator (capacitor 61 and resistor 62) is used for triggering the particular multivibrator circuit shown, other suitable edge triggered multivibrator circuits may be employed instead. The essential characteristic of the particular multivibrator used is that is have a period greater than one half but less than one full period of the A.C. input signal. Alternatively other circuits having edge triggered multivibrator-like characteristics may be employed in place of multivibrator 60. The essential characteristic of whatever circuit approach is used to perform the function of multivibrator 60 is that it be responsive to the alternating voltage (i.e., the voltage of period T across terminals 1 and 2) for producing an asymmetrical control signal (such as the node F potential) which is at a first level for a period between T/2 and T concurrent with two zero crossings of the alternating voltage and at a second level for the remainder of the period.

Means other than control switch 65 may be employed for inhibiting triggering of the multivibrator. For example, switch 65 may be replaced by a relay or a suitable semi-conductor switch such as a transistor, an optoelectric coupler or logic gate. It should be noted also that a shunt switch, rather that a series switch, may be used to control the multivibrator triggering in a given application.

Although NOR gates have been shown, other suitable logic means may be used instead, provided that it functions to allow the zero crossing detector pulses to trigger the triac during the on period of the multivibrator and prevents triggering of the triac otherwise. This can be accomplished, in fact, without the use of "conventional" logic gates by providing a higher level of "logic" in detector 30. For example, in FIG. 1 circuit 80 may be eliminated if (1) node D is connected to the triac gate, (2) a further transistor is connected at its emitter and collector to terminal 2 and node D, respectively, and (3) a current limiting resistor is connected between node F and the base of the further transistor. This arrangement is, logically speaking, the same as that shown in FIG. 1 but lacks the trigger drive capability afforded by transistor 81. Transistor 81, of course, may be eliminated in either of the examples of the invention where the particular logic gate chosen has adequate output drive capability to trigger the particular thyristor used.

Although a triac has been illustrated to perform the load current switching function, other suitable triggerable bidirectional switches may be employed instead. Alternatively, triggerable unidirectional switches may be employed if arranged suitably for bidirectional current switching. This may be accomplished, for example, by reverse parallel connected semiconductor controlled rectifiers (SCR's) or by a single SCR in a well known diode bridge configuration.

Limiter 10 provides a convenient means for regulating the circuit voltages but is not essential to the overall circuit operation. In FIG. 1, for example, node A may be connected directly to input terminal 1 to trigger detector 30. In that case the ratio of resistors 51 and 52 should be suitably adjusted to accommodate the higher terminal 1 voltage.

Direct current supply 20 may be eliminated in applications where another suitable source of direct current operating potential available.

Other suitable forms of zero crossing detectors may be employed rather than the one shown provided they produce an output signal at each axis crossing of their input signal. As previously noted, it is not essential that the detector additionally produce output signals at alternate axis crossings (node C in FIG. 1) since such signals may be otherwise derived (e.g., from node H as in the example of FIG. 2 or from terminal 1 as previously noted).

What is claimed is:

1. In a system which includes first and second terminals for receiving an alternating current signal of period T thereacross, a load connected between the first terminal and a third terminal, and the main conduction path of a gate controlled switch connected between the second and third terminals, a circuit for insuring that the switch, when closed, will be closed for an integral number of periods T, the circuit comprising, in combination:

first means responsive to said alternating current signal for producing a control signal at a first level for a period between T/2 and T beginning at an axis crossing of a given sense of said alternating current signal and at a second level for the remainder of the period;

second means responsive to the potential of a selected one of the first and third terminals for producing a trigger signal at each axis crossing thereof;

third means responsive to the control signal and to the trigger signals for applying the trigger signals to a gate electrode of the switch solely when the control signal is at the first level; and fourth means for initiating and terminating the control signal, in each case solely when the latter is at its second level.

2. The combination recited in claim 1 wherein said first means comprises a monostable multivibrator having input means coupled to said first terminal, the multivibrator being triggered by changes solely of a given sense in the potential of the first terminal.

3. The combination recited in claim 2 wherein said second means comprises a zero crossing detector having a common terminal coupled to said second terminal, an input terminal coupled to said third terminal and an output terminal for producing said trigger signal at each axis crossing of the potential across said second and third terminals.

4. The combination recited in claim 2 wherein said second means comprises a zero crossing detector having a common terminal coupled to said second terminal, an input terminal coupled to said first terminal and an output terminal for producing said trigger signal at each axis crossing of the potential across said first and second terminals.

5. The combination recited in claim 3 wherein said fourth means comprises:

a regenerative feedback path in said multivibrator for preventing retriggering of said multivibrator during the period said control signal is at said first level; and a switch in said input means operable in a first condition for priming said multivibrator to be triggered and in a second condition for inhibiting said multivibrator from being triggered.

6. The combination recited in claim 4 wherein said fourth means comprises:

a regenerative feedback path in said multivibrator for preventing retriggering of said multivibrator during the period said control signal is at said first level; and a switch in said input means operable in a first condition for priming said multivibrator to be triggered and in a second condition for inhibiting said multivibrator from being triggered.

7. An integral cycle zero voltage switching circuit for use with a load and a source of an alternating current signal having a period, T, comprising:

first, second and third circuit terminals, the first and second for connection to said source of said alternating current signal; the first and third for connection to said load;

a triggerable bidirectional switch connected across said second and third terminals, said switch having a switch trigger electrode responsive to a switch trigger signal supplied thereto for placing said switch in a conductive state;

an axis crossing detector having a detector input terminal coupled to a selected one of said first and third circuit terminals and a detector output terminal for producing said switch trigger signal at each axis crossing of the signal at said selected terminal;

logic circuit means coupled to said switch trigger electrode and said detector output terminal and responsive to a priming input signal applied to a priming signal input terminal thereof for applying said switch trigger signal produced by said detector to said switch trigger electrode solely when said priming signal is present;

a monostable multivibrator connected to said priming signal input terminal of said logic circuit means and responsive, when triggered, for producing and applying said priming signal thereto for a period between T/2 and T; and a multivibrator trigger control circuit connected to said multivibrator and responsive in a first control condition to axis crossings of a given sense of said alternating current signal across said first and second terminals for triggering said multivibrator and responsive in a second control condition for preventing the triggering of said multivibrator.

8. The integral cycle zero voltage switch set forth in claim 7 wherein said detector input terminal is coupled to said first circuit terminal.

9. The integral cycle zero voltage switch set forth in claim 7 wherein said detector input terminal is coupled to said third circuit terminal.

* * * * *